(12) United States Patent
Gmür

(10) Patent No.: US 7,056,649 B2
(45) Date of Patent: *Jun. 6, 2006

(54) PROCESS FOR PRODUCING A TOOL INSERT FOR INJECTION MOLDING A PART WITH TWO-STAGE MICROSTRUCTURES

(75) Inventor: Max Gmür, Mosnang (CH)

(73) Assignee: Weidmann Plastics Technology AG, Rapperswil (CH)

( * ) Notice: Subject to any disclaimer, the term of this patent is extended or adjusted under 35 U.S.C. 154(b) by 85 days.

This patent is subject to a terminal disclaimer.

(21) Appl. No.: 10/720,402

(22) Filed: Nov. 24, 2003

(65) Prior Publication Data

US 2004/0106069 A1 Jun. 3, 2004

(30) Foreign Application Priority Data

Nov. 25, 2002 (EP) .................................. 02079899

(51) Int. Cl.
G03C 1/73 (2006.01)
H01L 21/30 (2006.01)
(52) U.S. Cl. ...................... 430/320; 430/322; 430/323; 264/297.2; 264/458; 216/56; 216/67; 205/70; 438/455; 438/458; 438/459
(58) Field of Classification Search ................ 430/313, 430/314, 309, 322, 323, 316, 320; 264/41, 264/478, 297.2; 438/455, 458, 459; 205/70, 205/640; 216/56, 67, 13
See application file for complete search history.

(56) References Cited

U.S. PATENT DOCUMENTS 6,242,163 B1   6/2001   Stampfl et al.

6,764,924 B1 * 7/2004 Gmur ......................... 438/455
2002/0098611 A1   7/2002   Change et al.

OTHER PUBLICATIONS

Olsson et al., "Valve-Less Diffuser Micropumps Fabricated Using Thermoplastic Replication," Micro Electro Mechanical Systems, 1997. MEMS '97, Proceedings, IEEE., Jan. 26, 1997.

* cited by examiner

Primary Examiner—Thorl Chea
(74) Attorney, Agent, or Firm—Gibbons, Del Deo, Dolan, Griffinger & Vecchione

(57) ABSTRACT

A process for producing microstructured tool insert for injection molding a part, the part being fabricated of a synthetic material, a metal or a ceramic material and including an arrangement of microstructures which are formed on an outer surface of the part and have two different predetermined depths. The process comprises the following steps: (1) microstructuring the front side of the first wafer by means of plasma etching to form an arrangement of first microstructures, which are formed on the front side of the wafer and which have a first predetermined depth, (2) microstructuring the rear side of the first wafer by means of plasma etching to form an arrangement of the second microstructures which form cavities which have a first orifice on the rear side of the first wafer and issue into the first microstructures on the front side of the first wafer or have a second orifice on the front side of the first wafer, (3) bonding the rear side of the first wafer to a carrier substrate to form a master, (4) electrochemically depositing a metal layer on the front side of the first wafer and in the cavities which are present therein and are formed by the second microstructures, and (5) separating the metal layer from the master, wherein the separated metal layer can be used as a tool insert for injection molding a part.

16 Claims, 3 Drawing Sheets

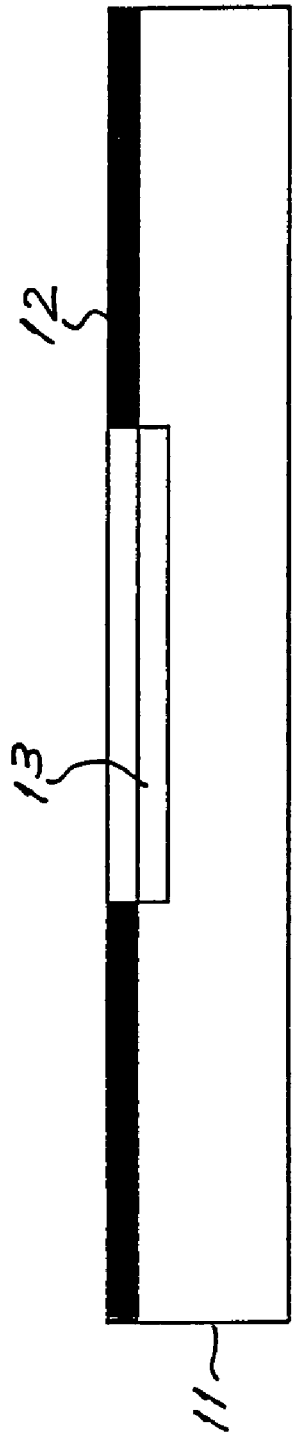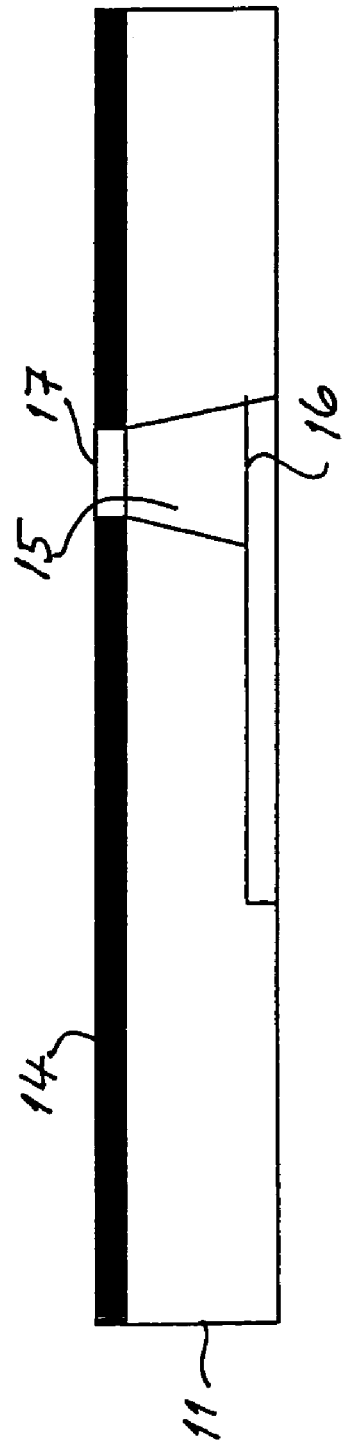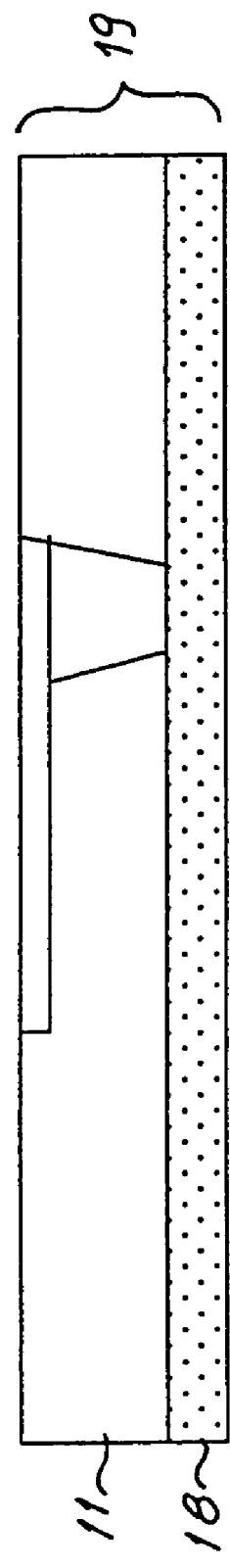

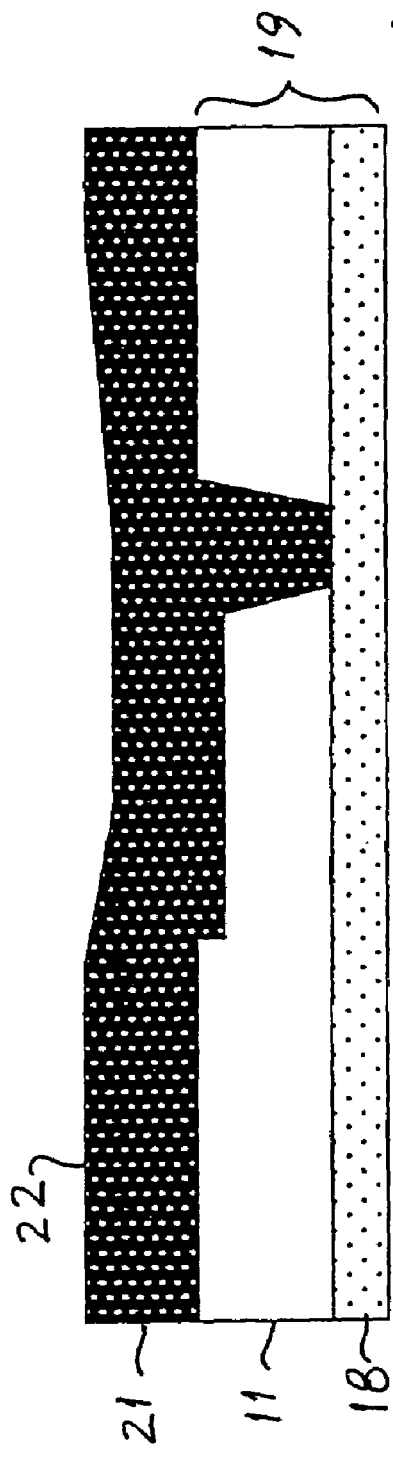
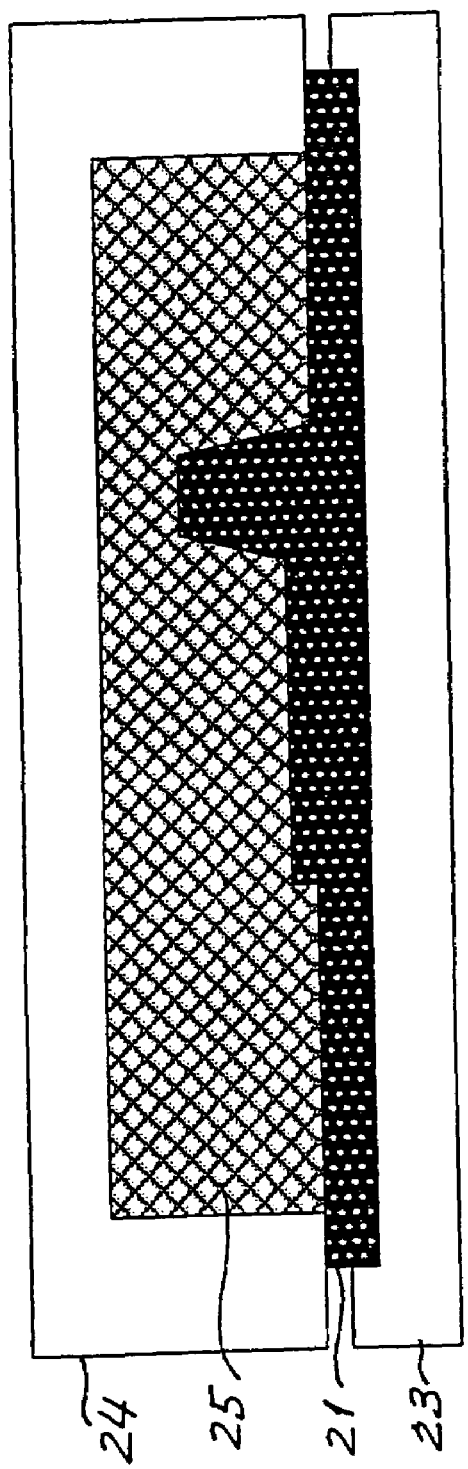

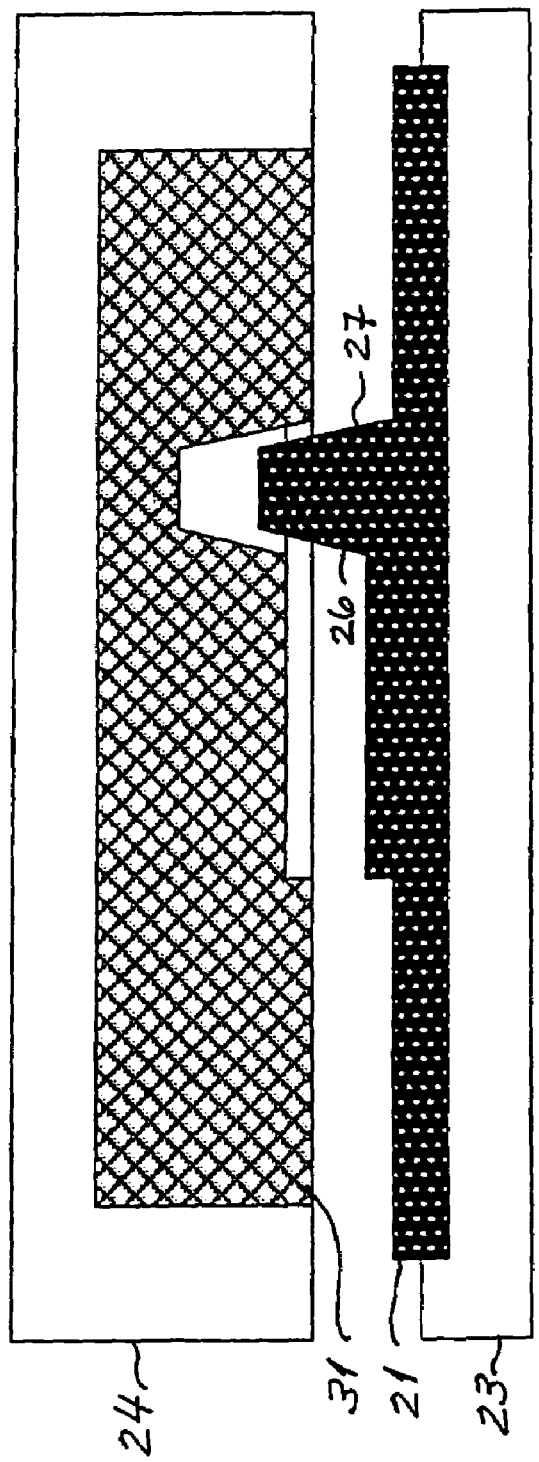
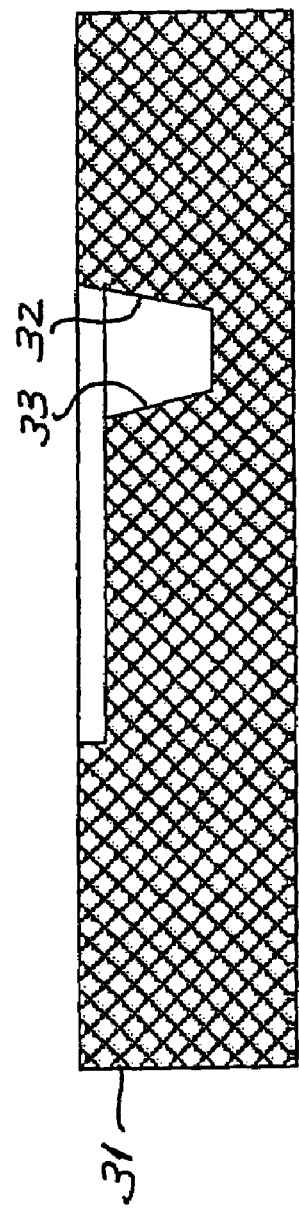

PROCESS FOR PRODUCING A TOOL INSERT FOR INJECTION MOLDING A PART WITH TWO-STAGE MICROSTRUCTURES

FIELD OF THE INVENTION

The invention relates to a process for producing a microstructured tool insert for injection molding a part, the part being fabricated of a synthetic material, a metal, or a ceramic material, and having an arrangement of microstructures formed on an outer part surface and wherein the microstructures have two different predetermined depths. The invention also relates to a process for molding a part using the tool insert.

BACKGROUND OF THE INVENTION

In order to ensure that parts which have been produced by means of injection molding can be removed from the tool after the injection molding process without the quality of the microstructures being impaired and in the case of a large number of microstructures without the force being excessive for removing the part from the molding tool, it is necessary to provide the microstructures with inclined surfaces which enable the part to be removed from the molding tool, which surfaces are inclined, for example, at an angle of greater than two (2) degrees, wherein this angle is measured in the cross-section between a side wall of the microstructure and a plane perpendicular to the outer surface of the part and to the cross-sectional plane.

There is a necessity to be able to produce microstructures with inclined surfaces which enable the part to removed from the molding tool and which are inclined at an angle greater, for example, than two (2) degrees particularly where the microstructures are extremely deep, for example, microstructures with a depth of 100 micrometer or a depth which is greater than 100 micrometer. This criterion is fulfilled for two-stage microstructures by the second, deeper structure and for this reason inclined surfaces which enable the part to be removed from the molding tool are essential for 2-stage microstructures.

The following processes are known which render it possible to produce parts with two-stage microstructures:
(A) Wet etching glass
(B) Dry etching silicon
(C) LIGA
(D) UV-LIGA
(E) Laser Machining
(F) Micro erosion
(G) Microcutting (drilling, machining, turning)

However, all of these known microstructuring processes are encumbered with the following disadvantages:

It is only possible to achieve a limited maximum depth of the structure using process (A). Process (B) is difficult to manage. Process (C) is extremely time-consuming and costly. The inclined surface which enables the part to be removed from the molding tool cannot be produced using process (D) or it can only be produced at great expense. The processes (E), (F), (G) have not been sufficiently developed for use in industry and in addition can only be performed in sequence.

SUMMARY OF THE INVENTION

Broadly, one aspect of the present invention relates to a technique for making a predetermined portion of a mold by forming at least one first microstructure on a front side of a wafer, said first microstructures having a first predetermined depth, then forming at least one second microstructure on a rear side of the wafer, said second microstructures having a second predetermined depth and inclined walls, then bonding the rear side of the wafer to a carrier substrate to form a master, then depositing metal on the wafer that fills the first and the second microstructures, and then separating the metal layer from the master. Another broad aspect of the present invention relates to molding a part using a mold incorporating the mold portion that has been fabricated as described above.

A first aim of the invention is to provide a microstructured tool insert of the type mentioned above which in the case of two-stage microstructures provides the inclined surfaces which enable the part to be removed from the molding tool to be produced at a relatively low cost.

According to a first aspect of the invention this first aim is achieved with a first process of the above-mentioned kind which comprises the following steps:

(a) photo-lithographically masking the front side of a first wafer with a first etching mask which corresponds to an arrangement of microstructures,
(b) micro-structuring the front side of the first wafer by means of plasma etching to form an arrangement of first microstructures which are formed on the front side of the wafer and have a first predetermined depth,
(c) removing the first etching mask from the front side of the first wafer,
(d) photo-lithographically masking the rear side of the first wafer with a second etching mask which corresponds to an arrangement of second microstructures, which are to be in fluid connection with the first microstructures on the front side of the first wafer,
(e) microstructuring the rear side of the first wafer by means of plasma etching to form an arrangement of second microstructures which form cavities which have a first orifice on the rear side of the first wafer and issue into the first microstructures on the front side of the first wafers or have a second orifice on the front side of the first wafer,
(f) removing the second etching mask from the rear side of the first wafer,
(g) bonding the rear side of the first wafer to a carrier substrate to form a master,
(h) applying an electrically conductive thin layer to the microstructured front side of the first wafer and to the carrier substrate surfaces which are accessible through the mentioned cavities,
(i) electrochemically depositing a metal layer on the front side of the first wafer and in the cavities which are present therein and are formed by the second microstructures,
(j) making planar the outer surface of the deposited metal layer, and
(k) separating the metal layer from the master, wherein the separated metal layer can be used as a tool insert for injection molding a part.

In a preferred embodiment of this process the first wafer is a silicon wafer.

In a preferred embodiment of the above-mentioned process the carrier substrate is a Pyrex® glass wafer.

In another preferred embodiment of the above-mentioned process the carrier substrate is a silicon wafer.

In a preferred embodiment of the above-mentioned process the deposited metal layer is a nickel layer.

In a preferred embodiment of the above-mentioned process the microstructuring of the rear side of the first wafer is performed by means of through-etching the first wafer with an undercut, so that the microstructures formed have a cross-section the width of which increases with the distance with respect to the rear side of the first wafer.

Moreover, a second aim of the invention is to provide a process for injection molding a part which comprises an arrangement of microstructures which are formed on an outer surface of the part, have two different predetermined depths and comprise inclined surfaces which enable the part to be removed from the molding tool, wherein a tool for injection molding is used which is formed from a first and a second tool half.

According to a second aspect of the invention this second aim is achieved with a second process of the above-mentioned kind which comprises the following steps:
  (a) installing a first tool insert as a first tool half which serves to shape the arrangement of microstructures, wherein the first tool insert is produced according to a process of the above mentioned kind,
  (b) installing a second tool insert as a second tool half which is arranged opposite the first tool half,
  (c) closing the tool for injection molding formed from the first and second tool insert,
  (d) injecting a material melt into the cavity between the first and the second tool insert,
  (e) cooling the injected material melt and
  (f) ejecting from the molding tool for injection molding a part which is formed by the setting of the injected material melt and which comprises microstructures with inclined surfaces which enable the part to be removed from the molding tool.

The advantages achieved using the processes in accordance with the invention are in particular as follows:

The process in accordance with the invention renders it possible in the case of two-stage microstructures in a convenient and inexpensive manner to produce inclined surfaces which enable the part to be removed from the molding tool, which surfaces are inclined, for example, at an angle greater than two (2) degrees. An important advantage of such inclined surfaces for removing the part from the molding tool is that they render it possible for the part to be removed from the molding tool without impairing the quality of the two-stage microstructures and for the forces required for removing the part from the molding tool to be low, even if the wafer comprises many microstructures.

The process in accordance with the invention obviates one disadvantage of dry etching silicon using the Bosch process, i.e. the fundamental undercutting of the structures.

The process in accordance with the invention has the additional advantage that uniformity of the depth of the etching of the two-stage microstructures is excellent which is otherwise not the case when dry etching silicon in particular when the orifices are of different widths.

BRIEF DESCRIPTION OF THE DRAWINGS

The subject invention will now be described in terms of its preferred embodiments with reference to the accompanying drawings. These embodiments are set forth to aid the understanding of the invention, but are not to be construed as limiting.

FIG. 1 shows the microstructuring of the front side of a first wafer performed by trench-etching using plasma etching to form an arrangement of microstructures, FIG. 2 shows the microstructuring of the rear side of the first wafer in FIG. 1 by means of plasma etching to form an arrangement of cavities produced by through-etching, FIG. 3 shows the bonding of the rear side of the first wafer to a carrier substrate to form a Galvano master, FIG. 4 shows the metal layer separated from the first wafer and the carrier substrate bonded thereto, FIG. 5 illustrates the use of a metal layer separated from the first wafer and from the carrier substrate bonded thereto as a shaping part of a tool insert which is produced in accordance with the invention and which is used as one tool half of a tool for injection molding a part, and the injection of a synthetic material melt into the inner cavity of the injection molding tool, FIG. 6 illustrates the removal of a part from the metal layer just mentioned, and FIG. 7 shows the part ejected from the molding tool for injection molding.

DETAILED DESCRIPTION OF PREFERRED EMBODIMENTS

Referring to FIGS. 1 to 4, a process for producing a microstructured tool insert for injection molding a synthetic material part is described below, which synthetic material part comprises an arrangement of microstructures which are formed on an outer surface of the synthetic material part and have two different predetermined depths. This process can also be used for injection molding a part which is produced from a metal or from a ceramic material.

As illustrated in FIG. 1, the front side of a silicon wafer 11 is masked photo-lithographically using an etching mask 12 and subsequently structured (hereinafter referred to as trench etching) to a desired depth by means of dry etching in a plasma (technical term: DRIE=Deep Reactive Ion Etching) consisting of ions and reactive fluorine radicals, wherein the fluorine radicals remove the silicon.

By means of trench etching, an arrangement of micro-channels 13 is produced in this manner on the front side of the silicon wafer ii. The micro-channels 13 have, for example, a depth of 50 micrometer. The silicon wafer 11 has, for example, a thickness of 250 micrometer.

As illustrated in FIG. 2, subsequently the etching mask 12 is removed from the front side, which has just been micro-structured, of the silicon wafer 11, the wafer 11 is turned, the rear side of the silicon wafer 11 is then masked photo-lithographically with an etching mask 14 and subsequently it is structured by means of drying etching according to the above described method, wherein this time the structures are driven through the wafer 11 (hereinafter referred to as 'through-etching') and thus an arrangement of cavities 15 is produced which have an first orifice 16 on the front side of the wafer 11 and a second orifice 17 on the rear side of the wafer 11 respectively.

Subsequently, the etching mask 14 is removed and the wafer 11 which is now structured, as illustrated in FIG. 3, is bonded to a carrier substrate 18 in order to increase the intrinsic stability and to seal the rear side of the wafer 11 so that nickel can be applied electro-chemically. A so-called Galvano master 19 is formed by bonding the wafer 1: and carrier substrate 18 in this manner.

Both Pyrex® glass wafers (glass with a high proportion of sodium) and also silicon wafers are suitable as the carrier substrate 18.

Pyrex® glass wafers are inseparably connected by means of anodic bonding to the microstructured silicon wafer. During the anodic bonding a high voltage, for example, of 1000 V is applied to the silicon and Pyrex® glass wafers which are laid one on top of the other. Sodium ions diffuse from the Pyrex® glass into the silicon and produce a high-strength ionic connection between the Pyrex® glass and silicon. The diffusion is further accelerated by increasing the temperature of the wafer, for example, to 400° C.).

Silicon wafers are inseparably connected by means of silicon fusion bonding to the microstructured silicon wafer. During the silicon fusion bonding, the surfaces to be connected on the silicon substrate and the microstructured silicon wafer are conditioned and subsequently covalently bonded under pressure and at a temperature provided that the two surfaces to be connected demonstrate an extremely low degree of roughness (less than 0.5 nanometer), so that the two surfaces come into direct contact with each other.

The next process step is to provide the microstructured silicon wafer 11 together with the carrier substrate 18, together referred to as the master 19, with a thin conductive layer which serves as the start layer for the electrochemical deposition described below. Gold, silver and nickel, for example, are suitable and they are physically applied by means of a sputtering process (also known under the term 'cathode atomization') or vapor deposition after coating with an adhesive layer of aluminum, titanium or chromium.

Subsequently, as illustrated in FIG. 4, the master 19 is electrically contacted via the conductive start layer and a thick metal layer 21, preferably a nickel layer, is electrochemically deposited to form a mechanically stable backing plate with a thickness of, for example, 1 millimeter. Following the above mentioned deposition of, for example, a nickel layer 21, also called nickel shim, the rear side 22 of the nickel shim 21 is first made planar. Suitable processes are eroding and polishing. Subsequently, the microstructured nickel tool insert 21 (hereinafter referred to as the 'shim') must be separated from the master 19. For this purpose, the master 19 is either mechanically separated from the shim 21 or dissolved in a suitable wet etching chemical process or by means of a dry etching process.

The separated metal layer 21 can be used as a shaping part of a tool insert produced in accordance with the invention and has lateral outer surfaces 26, 27 which render it possible to produce the inclined surfaces which enable the part to be removed from the molding tool and which are at an angle, for example, greater than 2 degrees.

A process for injection molding a synthetic material part is described below with reference to FIGS. 5 to 7.

For the purpose of injection molding a synthetic material part the nickel shim 21 is installed in a tool half 23 which is disposed opposite a second tool half 24 of the injection molding tool. The injection molding tool is closed and a synthetic material melt 25 is injected into the inner cavity of the injection molding tool.

Once the synthetic material melt 25 has set rigid and the injection molding tool has been opened, the synthetic material part 31 can be removed from the shim with only a small amount of force. Advantageously, the quality of the two-stage microstructures is not impaired and also when the wafer has many microstructures only small amounts of force are required to remove the synthetic material part. A further advantage of the above described process is that as a consequence two-stage microstructures which have an extremely good degree of uniformity in depth can be produced.

The synthetic material part 31 has microstructures with lateral inner surfaces 32, 33 which comprise inclined surfaces which enable the part to be removed from the molding tool and which are, for example, greater than 2 degrees.

In more general terms the process described above is a process for producing a portion of a mold, and said process comprising:

(a) etching at least one first microstructure on a front side of a wafer, the first microstructure having a first predetermined depth,
(b) etching at least one second microstructure on a rear side of said wafer, the second microstructure having a second predetermined depth and inclined walls,
(c) attaching the rear side of the wafer to a carrier substrate to form a master,
(d) depositing a material layer onto the master, the deposited material layer extending over the first and second microstructures, and
(e) separating the deposited metal layer from the master, wherein the separated metal layer can be used as the predetermined mold portion.

In a preferred embodiment, the first microstructure extends downwardly from the front side surface of the wafer.

In a preferred embodiment, the rear side of the wafer is attached to the carrier substrate with the first surface being adjacent to a second surface of the carrier substrate.

Although preferred embodiments of the invention have been described using specific terms, such description is for illustrative purposes only, and it is to be understood that changes and variations may be made without departing from the spirit or scope of the following claims.

What is claimed is:

1. A process for producing a microstructured tool insert for injection molding a part which is produced from a synthetic material, a metal or from a ceramic material, said process comprising:

(a) providing a wafer having a front side and a rear side;
(b) photo-lithographically masking the front side of the wafer with a first etching mask which corresponds to an arrangement of first microstructures,
(c) micro-structuring the front side of the wafer by means of plasma etching to form said arrangement of first microstructures on the front side of the wafer,
(d) removing the first etching mask from the front side of the wafer,
(e) photo-lithographically masking the rear side of the wafer with a second etching mask which corresponds to an arrangement of second microstructures, which are to be in fluid connection with the first microstructures on the front side of the wafer,
(f) microstructuring the rear side of the wafer by means of plasma etching to form said arrangement of second microstructures having cavities on the rear side of the wafer, and which cavities issue into the first microstructures on the front side of the wafer, said cavities having inclined side walls and a tapered cross section, the width of this cross section increasing with distance from the rear side of the wafer,
(g) removing the second etching mask from the rear side of the wafer,
(h) attaching the rear side of the wafer to a carrier substrate to form a master,
(i) applying an electrically conductive thin layer to the microstructured front side of the wafer and to the carrier substrate surfaces which are accessible through the mentioned cavities,
(j) electrochemically depositing a metal layer on the front side of the wafer and in the cavities which are present therein and are formed by the second microstructures,
(k) making planar the outer surface of said deposited metal layer, and
(k) separating said deposited metal layer from the master, wherein the separated metal layer can be used as a tool insert for injection molding a part.

2. The process of claim 1 wherein the wafer is a silicon wafer.

3. The process of claim 1 wherein the carrier substrate is a glass wafer.

4. The process of claim 1 wherein the carrier substrate is a silicon wafer.

5. The process of claim 1 wherein the deposited metal layer is a nickel layer.

6. The process of claim 1 wherein the microstructuring of the rear side of the wafer is performed by means of through-etching the wafer with an undercut, so that the microstructures formed have said tapered cross-section, the width of this cross section increasing with distance from the rear side of the wafer.

7. A process for injection molding a part which is produced from a synthetic material, a metal or from a ceramic material, said process comprising:
   (a) installing a tool insert in a first tool half which serves to shape the arrangement of microstructures, wherein the tool insert is produced according to a process comprising the steps of providing a wafer having a front side and a rear side, photo-lithographically masking the front side of a wafer with a first etching mask which corresponds to an arrangement of first microstructures, microstructuring the front side of the wafer by means of plasma etching to form said arrangement of first microstructures on the front side of the wafer, removing the first etching mask from the front side of the wafer, photo-lithographically masking the rear side of the wafer with a second etching mask which corresponds to an arrangement of second microstructures, which are to be in fluid connection with the first microstructures on the front side of the wafer, microstructuring the rear side of the wafer by means of plasma etching to form said arrangement of second microstructures having cavities which issue into the first microstructures on the front side of the wafer, said cavities having inclined side walls and a tapered cross section, the width of this cross section increasing with distance from the rear side of the wafer, removing the second etching mask from the rear side of the wafer, attaching the rear side of the wafer to a carrier substrate to form a master, applying an electrically conductive thin layer to the microstructured front side of the wafer and to the carrier substrate surfaces which are accessible through the mentioned cavities, electrochemically depositing a metal layer on the front side of the wafer and in the cavities which are present therein and are formed by the second microstructures, making planar the outer surface of said deposited metal layer, and separating said deposited metal layer from the master,
   (b) providing a second tool half,
   (c) bringing said first tool half and said second tool half into contact with one another so as to form a molding tool for injection molding, said molding tool having a cavity,
   (d) injecting a material melt into the cavity in the molding tool,
   (e) cooling the injected material melt, and
   (f) ejecting from the molding tool for injection molding a part which is formed by the setting of the injected material melt.

8. A process for producing a tool insert for use as a component of a mold, said process comprising:
   (a) providing a wafer having a front side and a rear side,
   (b) etching at least one first microstructure on the front side of the wafer, said at least one first microstructure having a first depth,
   (c) etching at least one second microstructure on the rear side of the wafer, said at least one second microstructure having a second depth and inclined walls,
   (d) bonding the rear side of the wafer to a carrier substrate to form a master,
   (e) depositing a metal layer on the wafer that fills the first and the second microstructures, and
   (f) separating said metal layer from the master.

9. The process of claim 8 wherein etching said at least one first microstructure includes masking the front side of the wafer with a first etching mask which corresponds to the first microstructure.

10. The process of claim 8 wherein etching the at least one first microstructure includes etching the front side of the wafer after masking this side with a first etching mask.

11. The process of claim 10 wherein the etching is plasma etching.

12. The process of claim 8 wherein etching the at least one second microstructure includes masking the rear side of the wafer with a second etching mask which corresponds to the second microstructure.

13. The process of claim 8 wherein etching the at least one second microstructure includes etching the rear side of the wafer after masking of this side with the second etching mask.

14. The process of claim 13 wherein the etching is plasma etching.

15. The process of claim 8 wherein depositing of the metal layer includes applying an electrically conductive thin layer to the front side of the wafer and to the carrier substrate surfaces followed by electrochemically depositing a metal layer on the front side of the wafer and in the at least one first microstructure and the at least one second microstructure.

16. A process for molding a part using a mold having a first mold portion and a second mold portion, said process comprising:
   (a) installing a tool insert into a cavity of said first mold portion, said tool insert serving to shape an arrangement of microstructures on the part, wherein said tool insert is produced according to a process comprising the steps of providing a wafer having a front side and a rear side, etching at least one first microstructure on the front side of the wafer, said first microstructure having a first depth, etching at least one second microstructure on a rear side of the wafer, said second microstructure having a second depth and inclined walls, bonding the rear side of the wafer to a carrier substrate to form a master, depositing metal on the wafer that fills the first and the second microstructures, and separating the metal layer from the master,
   (b) forming said mold by bringing said first mold portion and said second mold portion into contact with one another,
   (c) introducing a material melt into said mold formed by said first and second mold portions,
   (d) cooling said material melt and
   (e) removing said cooled material melt from said mold.

* * * * *